(12) United States Patent
Hue

(10) Patent No.: US 9,915,831 B2
(45) Date of Patent: Mar. 13, 2018

(54) ADAPTIVE OPTICAL FILTER FOR SPECTACLE LENSES

(71) Applicant: Valeo Vision, Bobigny (FR)

(72) Inventor: David Hue, Butry sur Oise (FR)

(73) Assignee: VALEO VISION, Bobigny (FR)

( * ) Notice: Subject to any disclaimer, the term of this patent is extended or adjusted under 35 U.S.C. 154(b) by 93 days.

(21) Appl. No.: 14/912,235

(22) PCT Filed: Sep. 26, 2014

(86) PCT No.: PCT/EP2014/070631
§ 371 (c)(1),
(2) Date: Feb. 16, 2016

(87) PCT Pub. No.: WO2015/044354
PCT Pub. Date: Apr. 2, 2015

(65) Prior Publication Data
US 2016/0202497 A1   Jul. 14, 2016

(30) Foreign Application Priority Data

Sep. 26, 2013   (FR) ...................................... 13 59258

(51) Int. Cl.
*G02C 7/16*       (2006.01)
*G02C 7/10*       (2006.01)
*B81B 7/02*       (2006.01)

(52) U.S. Cl.
CPC ............... *G02C 7/101* (2013.01); *B81B 7/02* (2013.01); *G02C 7/105* (2013.01); *B81B 2201/047* (2013.01); *G02C 2202/18* (2013.01)

(58) Field of Classification Search
CPC ........ G02C 11/10; G02C 7/025; G02C 7/027; G02C 7/101; G02C 7/06; G02F 1/13318; G02F 1/13342; G02F 1/133514; G02F 2001/13312; G02F 2001/294
USPC ................... 351/41, 158, 49, 45, 46; 349/13
See application file for complete search history.

(56) References Cited

U.S. PATENT DOCUMENTS

| | | |
|---|---|---|
| 3,199,114 A | 8/1965 | Malifaud |
| 3,961,181 A | 6/1976 | Golden |
| 4,286,308 A | 8/1981 | Wolff |
| 4,311,368 A | 1/1982 | Saito et al. |
| 4,848,890 A | 7/1989 | Horn |
| 5,258,607 A | 11/1993 | Agostini et al. |
| 5,276,539 A | 1/1994 | Humphrey |
| 5,486,938 A | 1/1996 | Aigrain |

(Continued)

FOREIGN PATENT DOCUMENTS

| CN | 301804989 | 1/2012 |
|---|---|---|
| CN | 102707456 A | 10/2012 |

(Continued)

*Primary Examiner* — Hung Dang
(74) *Attorney, Agent, or Firm* — Oblon, McClelland, Maier & Neustadt, L.L.P.

(57) ABSTRACT

An adaptive optical filter for a spectacle lens, comprising at least two separate zones (10_M, 10_S), each being defined by an instantaneous value of at least one optical property. The optical property (CT) of at least one of the zones (10_M, 10_S) of the adaptive optical filter (10) is variable over time between a maximum value ($CT_{MAX}$) and a minimum value ($CT_{min}$).

17 Claims, 3 Drawing Sheets

(56) References Cited

U.S. PATENT DOCUMENTS

| | | |
|---|---|---|
| 5,671,035 A | 9/1997 | Barnes |
| 5,835,458 A | 11/1998 | Bischel et al. |
| 5,859,735 A | 1/1999 | De Vries |
| 5,911,018 A | 6/1999 | Bischel et al. |
| 5,978,524 A | 11/1999 | Bischel et al. |
| 6,078,704 A | 6/2000 | Bischel et al. |
| 6,118,908 A | 9/2000 | Bischel et al. |
| 6,133,686 A | 10/2000 | Inoue et al. |
| 6,141,465 A | 10/2000 | Bischel et al. |
| 6,313,587 B1 | 11/2001 | MacLennan et al. |
| 6,384,982 B1 | 5/2002 | Spitzer |
| 6,424,448 B1 | 7/2002 | Levy |
| 6,493,128 B1 | 12/2002 | Agrawal et al. |
| 6,522,794 B1 | 2/2003 | Bischel et al. |
| 6,557,995 B1 | 5/2003 | Edwards |
| 6,568,738 B1 | 5/2003 | Braun |
| 6,624,564 B2 | 9/2003 | Wang et al. |
| 6,626,532 B1 * | 9/2003 | Nishioka ............... G02C 7/083 351/41 |
| 6,928,180 B2 | 8/2005 | Stam et al. |
| 7,134,707 B2 | 11/2006 | Isaac |
| 7,684,105 B2 | 3/2010 | Lamontagne et al. |
| 7,751,122 B2 | 7/2010 | Amitai |
| 7,874,666 B2 | 1/2011 | Xu et al. |
| 7,893,890 B2 | 2/2011 | Kelly et al. |
| 7,970,172 B1 | 6/2011 | Hendrickson |
| 8,197,931 B2 | 6/2012 | Ueda et al. |
| 8,208,504 B2 | 6/2012 | Dantus et al. |
| 8,233,102 B2 | 7/2012 | Burlingame et al. |
| D665,009 S | 8/2012 | Nibauer et al. |
| D717,865 S | 11/2014 | Votel et al. |
| 8,964,298 B2 | 2/2015 | Haddick et al. |
| 8,976,084 B2 | 3/2015 | Hamdani et al. |
| D734,808 S | 7/2015 | Markovitz et al. |
| 9,087,471 B2 | 7/2015 | Miao |
| D735,799 S | 8/2015 | Markovitz et al. |
| 9,186,963 B2 | 11/2015 | Tewari et al. |
| D746,362 S | 12/2015 | Markovitz et al. |
| D747,403 S | 1/2016 | Markovitz et al. |
| 9,277,159 B2 | 3/2016 | Shin et al. |
| D763,944 S | 8/2016 | Shin |
| D765,761 S | 9/2016 | Votel et al. |
| D769,358 S | 10/2016 | Markovitz et al. |
| D769,362 S | 10/2016 | Markovitz et al. |
| D769,962 S | 10/2016 | Markovitz et al. |
| 9,511,650 B2 | 12/2016 | Momot |
| 2002/0175615 A1 | 11/2002 | Wang et al. |
| 2006/0140502 A1 | 6/2006 | Tseng et al. |
| 2006/0175859 A1 | 8/2006 | Isaac |
| 2007/0285759 A1 | 12/2007 | Ash et al. |
| 2008/0186604 A1 | 8/2008 | Amitai |
| 2008/0218434 A1 | 9/2008 | Kelly et al. |
| 2009/0213282 A1 | 8/2009 | Burlingame et al. |
| 2009/0213283 A1 | 8/2009 | Burlingame et al. |
| 2010/0065721 A1 | 3/2010 | Broude et al. |
| 2010/0161177 A1 | 6/2010 | Yuter |
| 2010/0194857 A1 | 8/2010 | Mentz et al. |
| 2011/0072961 A1 | 3/2011 | Jungkuist et al. |
| 2011/0233384 A1 | 9/2011 | Wu et al. |
| 2011/0288725 A1 | 11/2011 | Yuter |
| 2012/0019891 A1 | 1/2012 | Dewell |
| 2012/0026071 A1 | 2/2012 | Hamdani et al. |
| 2012/0044560 A9 | 2/2012 | Lam et al. |
| 2012/0126099 A1 | 5/2012 | Tewari et al. |
| 2012/0180204 A1 | 7/2012 | Hawkins |
| 2012/0303214 A1 | 11/2012 | Yuter |
| 2013/0113973 A1 | 5/2013 | Miao |
| 2013/0127980 A1 | 5/2013 | Haddick et al. |
| 2013/0300911 A1 | 11/2013 | Beckman |
| 2014/0109302 A1 | 4/2014 | Casbi et al. |
| 2014/0153076 A1 | 6/2014 | Tewari et al. |
| 2014/0253816 A1 | 9/2014 | Shin et al. |
| 2015/0062469 A1 | 3/2015 | Fleury |
| 2015/0077826 A1 | 3/2015 | Beckman |
| 2016/0077400 A1 | 3/2016 | Lam et al. |
| 2016/0214467 A1 | 7/2016 | El Idrissi et al. |
| 2016/0216536 A1 | 7/2016 | Hue et al. |
| 2016/0223816 A1 | 8/2016 | Hue et al. |
| 2016/0357014 A1 | 12/2016 | Beckman |
| 2017/0023802 A1 | 1/2017 | El Idrissi et al. |

FOREIGN PATENT DOCUMENTS

| | | |
|---|---|---|
| DE | 2001086 A1 | 7/1971 |
| DE | 3836095 A1 | 4/1990 |
| DE | 102012008913 A1 | 11/2012 |
| EP | 0341519 A2 | 11/1989 |
| EP | 0459433 A1 | 12/1991 |
| EP | 0498143 A1 | 8/1992 |
| EP | 0945303 A1 | 9/1999 |
| FR | 2684770 A1 | 6/1993 |
| FR | 2693562 A1 | 1/1994 |
| FR | 2722581 A1 | 1/1996 |
| FR | 2781289 A1 | 1/2000 |
| FR | 2846756 A1 | 5/2004 |
| FR | 2941786 A1 | 8/2010 |
| FR | 2975792 A1 | 11/2012 |
| FR | 2976089 A1 | 12/2012 |
| FR | 2988493 A1 | 9/2013 |
| FR | 3010941 A1 | 3/2015 |
| FR | 3011091 A1 | 3/2015 |
| GB | 2420183 A | 5/2006 |
| GB | 2445365 A | 7/2008 |
| JP | 2004233908 A | 8/2004 |
| WO | 9210130 A1 | 6/1992 |
| WO | 9214625 A1 | 9/1992 |
| WO | 9512502 A1 | 5/1995 |
| WO | 9620846 A1 | 7/1996 |
| WO | 9827452 A1 | 6/1998 |
| WO | 2012036638 A1 | 3/2012 |
| WO | 2012115301 A1 | 8/2012 |

* cited by examiner

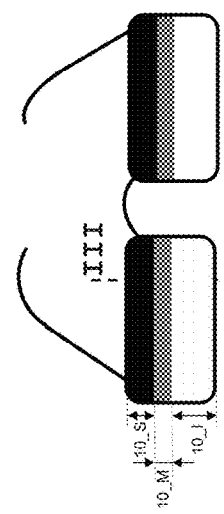
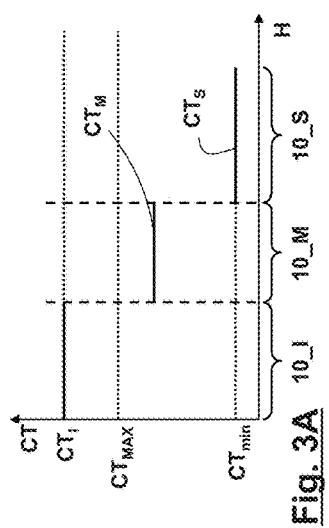
Fig. 2A
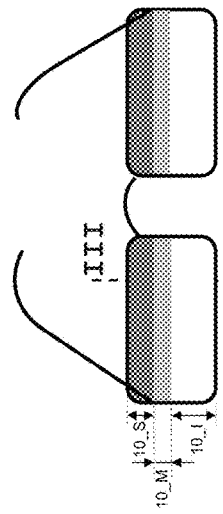
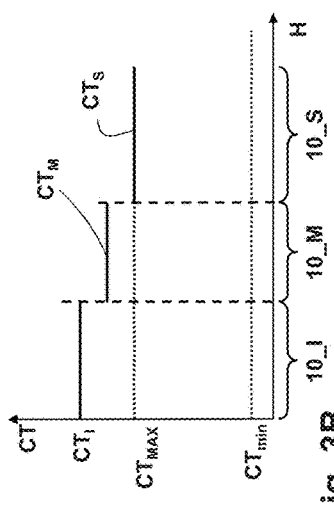
Fig. 2B
Fig. 3A
Fig. 3B

ADAPTIVE OPTICAL FILTER FOR SPECTACLE LENSES

CROSS-REFERENCE TO RELATED APPLICATIONS

This application is the U.S. National Phase application of PCT Application No. PCT/EP2014/070631 filed Sep. 26, 2014, which claims priority to the French application 1359258 filed on Sep. 26, 2013, which applications are incorporated herein by reference and made a part hereof.

BACKGROUND OF THE INVENTION

1. Field of the Invention

The present invention relates to optical filters, used as optical shutters to control the attenuation of a light intensity, adaptively in response to exterior conditions or on command by a user. The invention may advantageously be implemented in sunglasses to protect from glare.

2. Description of the Related Art

Many types of sunglasses are already known, using:
simple tinted lenses of uniform color or having a color gradient; or
photochromic lenses that tint depending on the amount of ultraviolet light to which they are subjected, and that gradually return to their clear state when the exposure to ultraviolet ceases.

Documents FR 2 722 581 and WO 98/27452 disclose spectacles the lenses of which comprise, in the vertical direction:
a polarized upper zone;
a polarization-neutral lower zone; and
a median zone the polarization of which degrades continuously from the upper zone to the lower zone.

Such spectacles allow their user to spontaneously or naturally adopt a vision position permitting vision through the lower zone, and a deliberate vision position, in which his head is downwardly inclined to a greater or lesser extent, permitting:
either vision through the upper zone, which greatly attenuates polarized light that is incident or reflected from faraway sources;
or vision through the median zone, in order to modify at the discretion of the spectacle wearer the degree of attenuation of far-field sources;
or vision through the lower zone, which produces no attenuation for observation of the near field.

Documents EP 0 341 519, FR 2 693 562 and FR 2 975 792 disclose spectacles the frame of which comprises a photosensitive sensor and the lenses of which include a liquid-crystal layer, the sensor emitting a signal that is an increasing function of the light intensity reaching it, and an electronic circuit controlling the liquid crystals in such a way that the transmittance of the liquid crystals decreases when the light intensity received by the sensor increases.

Document FR 2 781 289 discloses spectacles the frame of which comprises a photosensitive sensor emitting a signal the power of which increases as a function of the light intensity reaching it, an electronic circuit connected to the sensor and emitting a secondary AC signal the power of which increases with the power of the signal emitted by the sensor, and lenses including an electro-optical screen, the electronic circuit making the frequency of the secondary signal vary, an increase in light intensity resulting in a decrease in the transmittance of the spectacle lenses.

Lastly, document WO 2012/036638 discloses a pair of liquid-crystal ophthalmic spectacles the lenses of which include an upper zone for far vision, a lower zone for near vision, and an element of variable transparency. In near-vision mode, the lens zone for far vision is opacified, and the lens zone for near vision is clear or transparent. In far-vision mode, the lens zones for far and near vision are clear or transparent. The aim of these spectacles is to encourage the wearer to use the upper zone of the lenses for far vision, and the lower zone for near vision, instead of accommodating using the upper zone, in order to treat or prevent myopia.

There is, therefore, a need to provide an improved lens that overcomes one or more problems in the prior art.

SUMMARY OF THE INVENTION

The present invention operates in this context and it has the aim of providing an adaptive optical filter, especially intended to form a spectacle lens, capable of having a light transmission of almost zero in order to allow dazzle to be avoided, and a maximum light transmission, especially of about 100%, in order to allow clear vision in the absence of a source of glare in the field of view, the passage from one transmission state to the other being gradual.

With this aim, the subject of the present invention is an adaptive optical filter for a spectacle lens, comprising at least two separate zones (10_M, 10_S), one preferably being located above the other, each of the zones being defined by an instantaneous value of at least one optical property, the optical property preferably being the light transmission coefficient.

According to the invention, the optical property (CT) of at least one of the zones (10_M, 10_S) of the adaptive optical filter (10) is variable over time between a maximum value ($CT_{MAX}$) and a minimum value ($CT_{min}$).

Preferably, the transmission coefficient of the lower zone is higher than that of the upper zone.

According to other features of the invention, to be considered separately or in combination:
the light transmission coefficient of at least one of the zones of the adaptive optical filter is variable according to a pulse width modulation;
at least one of the zones of the adaptive optical filter includes a liquid-crystal cell;
at least one of the zones of the adaptive optical filter includes a micro-optical-electromechanical system;
the adaptive optical filter includes two zones the light transmission coefficient of each of which is variable over time between a maximum value and a minimum value;
the light transmission coefficient of one of the zones depends on the light transmission coefficient of the other zone;
the light transmission coefficient of at least one of the zones of the adaptive optical filter depends on the duty cycle of the pulse width modulation cycle;
the duty cycle of the pulse width modulation cycle of the light transmission coefficient of one of the zones depends on the duty cycle of the pulse width modulation cycle of the light transmission coefficient of an adjacent zone;
the light transmission coefficient is controlled by a control signal issued from a photosensitive sensor;

the photosensitive sensor emits a signal the value of which depends on the light intensity that it receives from the scene in front of the spectacle wearer;

the light transmission coefficient is controlled by a manual control signal; and/or the adaptive optical filter comprises a zone the light transmission coefficient of which is constant over time.

These and other objects and advantages of the invention will be apparent from the following description, the accompanying drawings and the appended claims.

BRIEF DESCRIPTION OF THE ACCOMPANYING DRAWINGS

Other aims, features and advantages of the present invention will become clearly apparent from the description that will now be given of an exemplary nonlimiting embodiment with reference to the appended drawings, in which:

FIG. 1 schematically a perspective view of an adaptive optical filter produced according to the present invention;

FIGS. 2A and 2B schematically show a pair of spectacles incorporating two filters produced according to the present invention, in two operating states;

FIGS. 3A and 3B show operational graphs explaining the states shown in FIGS. 2A and 2B;

DETAILED DESCRIPTION OF THE PREFERRED EMBODIMENTS

Figure 1:
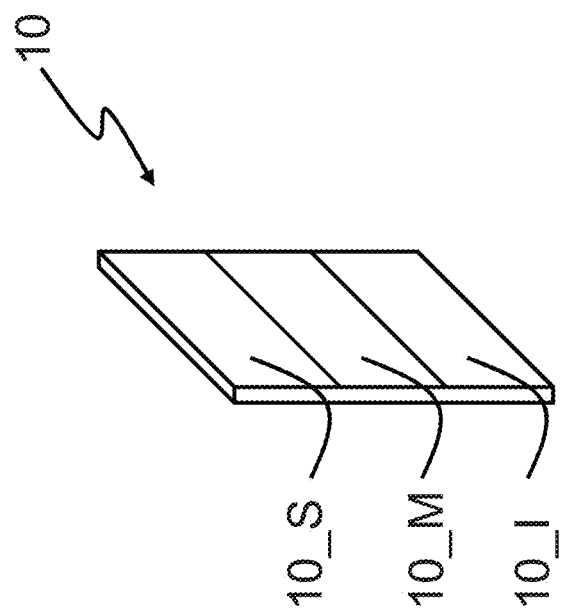

FIG. 1 shows a schematic perspective view of an adaptive optical filter or spectacle lenses produced according to the teachings of the present invention. In the nonlimiting example shown in this figure, the filter or spectacle lenses, designated in its entirety by the reference 10, includes three zones:

a lower zone 10_I,
a median zone 10_M, and
an upper zone 10_S.

The lower zone 10_I has a fixed transmission coefficient $CT_I$, of maximum value. In other words, the lower zone 10_I lets a maximum of light pass through.

The upper zone 10_S has a light transmission coefficient $CT_S$ that is variable over time, under the control of an electric signal. This transmission coefficient $CT_S$ may thus take any value between a maximum value $CT_{MAX}$, for which a maximum amount of light is transmitted, and a minimum value $CT_{min}$, for which a minimum amount of light is transmitted.

The median zone 10_M has a light transmission coefficient $CT_M$ that is variable over time, so that its instantaneous value is always comprised between the fixed value $CT_I$ and the variable value $CT_S$.

The filter in FIG. 1 is intended to equip a pair of spectacles, as shown in FIGS. 2A-2B and 3A-3B.

FIGS. 2A and 2B show a pair of spectacles, each of the spectacle lenses 10 of which incorporates at least one filter produced according to the present invention, in two operating states.

There may be seen:

in FIG. 2A a pair of spectacles, each of the spectacle lenses 10 of which includes a lower zone 10_I, a median zone 10_M, and an upper zone 10_S; and in FIG. 3A, the variation in the transmission coefficient of these spectacle lenses 10 along the line III-III in FIG. 2A, the abscisse being taken along this vertical line III-III.

FIGS. 2A and 3A clearly show that the lower zone 10_I possesses a transmission coefficient $CT_I$ that is constant over the entire height of this lower zone 10_I, and of a maximum value.

Likewise, the upper zone 10_S possesses a transmission coefficient $CT_S$ that is constant over the entire height of this upper zone 10_S, and of value $CT_S$ lower than the value $CT_I$ of the transmission coefficient of the lower zone 10_I. In the example shown, the value $CT_S$ of the transmission coefficient of the upper zone 10_S is equal to the minimum value $CT_{min}$.

The median zone 10_M possesses a transmission coefficient $CT_M$ that is variable, and the value of which is comprised between the values of the transmission coefficients $CT_I$ and $CT_S$ of the adjacent lower and upper zones 10_I and 10_S. For example, the instantaneous value of $CT_M$ will possibly be equal at any instant to the arithmetic mean of the values $CT_I$ and $CT_S$.

According to the present invention, and as already mentioned above, the transmission coefficients are $CT_S$ of the upper zone 10_S and $CT_M$ of the median zone 10_M variable over time, such that:

the light transmission coefficient $CT_S$ of the upper zone 10_S is variable over time, and may take any value comprised between a maximum value $CT_{MAX}$, for which a maximum amount of light is transmitted, and a minimum value $CT_{min}$, for which a minimum amount of light is transmitted; and the light transmission coefficient $CT_M$ of the median zone 10_M is constantly comprised between:

the variable instantaneous value $CT_S$ of the light transmission coefficient of the upper zone 10_S, and the fixed maximum value $CT_I$ of the light transmission coefficient of the lower zone 10_I.

the light transmission coefficient $CT_M$ for example being equal to the arithmetic mean of the constant and variable values $CT_I$, $CT_S$.

This is indeed what may be seen in FIGS. 2B and 3B, from which it is apparent that:

the light transmission coefficient $CT_S$ has taken its maximum value $CT_{MAX}$, and that the light transmission coefficient $CT_M$ is still comprised between the new value $CT_S$ of the transmission coefficient of the upper zone 10_S and the constant value $CT_I$ of the transmission coefficient of the lower zone 10_I.

Therefore, according to the invention, a spectacle lens 10 comprising an adaptive optical filter has indeed been produced, the optical filter being capable of exhibiting:

in its upper zone 10_S, a light transmission coefficient $CT_S$ that is variable between:

a minimum value $CT_{min}$ of almost zero in order to prevent dazzling by light sources in the field of view of the spectacle wearer, and a maximum value $CT_{MAX}$ that is the highest allowed by the technology used to vary this transmission coefficient, in order to allow the spectacle wearer to observe the far field in the scene in front of him;

in its lower zone 10_I, a constant light transmission coefficient $CT_I$ of maximum value, in order to allow the spectacle wearer to perfectly distinguish objects in the near field in front of him; and in its median zone 10_M, a light transmission coefficient $CT_M$ the value of which is at any instant comprised between the constant value $CT_I$ of the transmission coefficient of the lower zone 10_I and the variable value $CT_S$ of the transmission coefficient of the upper zone 10_S, in order to spare the spectacle wearer from an abrupt variation in the attenuation procured by the lower zone 10_I and upper zone 10_S, whatever the attenuation provided by the latter.

Various technologies allow filters to be produced, for example to produce spectacle lenses 10, having a transmission coefficient that is variable over time in order to implement the invention described above.

According to a first embodiment, liquid-crystal cells will possibly be used as constituent materials of the spectacle lenses 10, which are then controlled by an electric signal.

Conventionally, a liquid-crystal cell includes two polarization filters, a polarizer and an analyzer, enclosing a liquid-crystal layer. Transparent electrodes are deposited on those faces of the polarization filters which are turned toward the liquid-crystal layer, and the application of an electric field between these two electrodes allows the polarization state of the liquid-crystal layer to be switched, and therefore the light transmission coefficient to be modified, by the cell, between a zero value, for which the cell is opaque, and a maximum value, for which the cell has a maximum transparency.

Figure 4A:
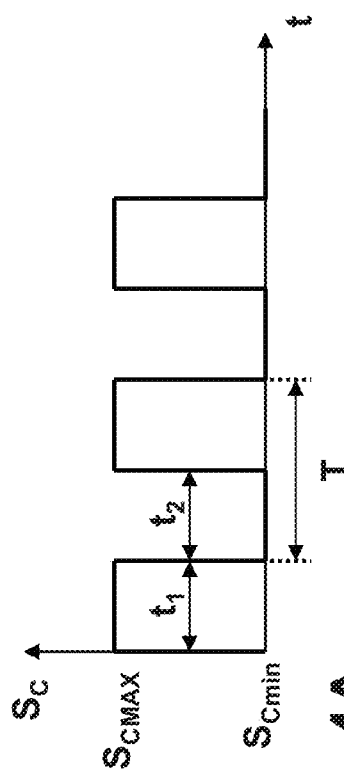
FIGS. 4A and 4B show graphs of the temporal variation of the various signals used in the present invention.
Figure 4B:
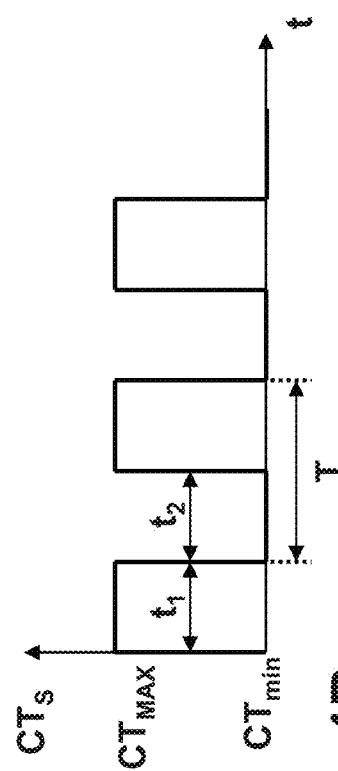

Preferably, a digital, i.e. alternating, and preferably pulse-width-modulated (pulse width modulation PWM) signal having a preset frequency, as shown in the graphs in FIGS. 4A and 4B, will preferably be used as the electric control signal controlling the transmission coefficient of the liquid crystal 16_S or 16_M.

In the following description, only the control of the transmission coefficient $CT_S$ of the upper zone 10_S will be described. These explanations are easily transposable to the control of the transmission coefficient $CT_M$ of the median zone 10_M.

The electric control signal will possibly be issued from a manual control (not shown) actuated directly by the spectacle wearer, in order to control the transmission coefficient of the upper zone 10_S.

Preferably, the electric control signal will possibly be issued from a photosensitive sensor (not shown), emitting a signal the value of which depends on the light intensity that it receives from the scene in front of the spectacle wearer, and associated with a circuit that converts this signal into a PWM-coded digital control signal Sc, in order to automatically control the transmission coefficient of the filter composing a zone of the spectacle lens 10, and in particular its upper zone 10_S, depending on the luminosity emanating from the scene located in front of the spectacle wearer.

As may be seen in FIG. 4A, this control signal $S_C$ varies between a value $S_{CMAX}$ during a duration $t_1$ and a value $S_{Cmin}$ during a duration $t_2$, the sum of the durations $t_1$ and $t_2$ defining the period T of the alternating signal $S_C$, which is in addition characterized by a duty cycle $\alpha$.

It will be recalled that the duty cycle $\alpha$ of the signal $S_C$ is defined by the ratio of the duration $t_1$ during which the signal is maximum, to the duration T of the period, and therefore varies from 0 to 100%:

$$\alpha = \frac{t_1}{T}$$

The duty cycle $\alpha$ of the signal $S_C$ thus appears as a direct function either of the light intensity received by the photosensitive sensor, or of the setpoint value set by the spectacle wearer. In FIG. 4A, the control signal $S_C$ shown is,
pulse-width modulated,
at a preset frequency $$v = \frac{1}{T}$$

and
with a duty cycle $\alpha$, in accordance with the graph in FIG. 4A.

This control signal $S_C$ then controls the transmission coefficient $CT_S$ of the upper zone 10_S of the spectacle lenses 10.

As shown in FIG. 4B, the transmission coefficient $CT_S$ varies in response to the signal $S_C$, between a value $CT_{MAX}$ during the duration $t_1$ and a value $CT_{min}$ during the duration $t_2$, with the same duty cycle $\alpha$ as the signal $S_C$ and the same frequency $v$.

The value $CT_{MAX}$ is that for which the spectacle lenses 10 have their maximum transparency. In most cases, liquid-crystal screens have this state in the absence of any electrical excitation, i.e. in the rest state, and are opaque only under the effect of an electric field. In these cases, the value $CT_{MAX}$ corresponds to a minimum excitation of the liquid crystals forming the spectacle lenses 10.

In certain cases, the rest state of a liquid-crystal screen will possibly be that in which the liquid crystals have their maximum opacity, becoming transparent only under the effect of an electric field. In this eventuality, the value $CT_{MAX}$ corresponds to a maximum excitation of the liquid crystals forming the upper zone 10_S of the spectacle lenses 10.

The above explanations apply, mutatis mutandis, to the value $CT_{min}$ of the transmission coefficient of the spectacle lenses 10.

The graph in FIG. 4B thus shows the variation in the transmission coefficient $CT_S$ of the upper zone 10_S of the spectacle lenses 10, and not the variation in the excitation signal of these spectacle lenses 10.

The spectacle wearer may therefore observe the scene in front of him through the spectacle lenses 10, the upper zone 10_S of which has a transmission coefficient that is adjusted:
either in real-time depending on the luminosity of the scene: the brighter this scene, the more the upper zones 10_S of the variable-transmission spectacle lenses 10 attenuate the light reaching the spectacle wearer;
or according to the setpoint value given by the spectacle wearer, depending on the attenuation that he would like to see delivered by the upper zone 10_S of the lenses 10.

The automatic or manual variation in the transmission coefficient $CT_S$ of the upper zone 10_S of the spectacle lenses 10 is thus obtained by a succession of maximum and minimum transparency states of the spectacle lenses 10, at a frequency $v$ and with a duty cycle $\alpha$. The frequency $v$ is chosen to be sufficiently high to prevent any flicker effect for the spectacle wearer. The frequency $v$ will for example be higher than 100 Hz in order to benefit completely from the effect of persistence of vision.

As a result thereof, the average transmission coefficient, perceived by the spectacle wearer, will be able to vary between $CT_{min}$ for $\alpha=0$ and $CT_{MAX}$ for $\alpha=100$.

The automatic or manual variation of the transmission coefficient $CT_M$ of the median zone 10_M of the spectacle lenses 10 is obtained in the same way, by a succession of maximum and minimum transparency states of this zone 10_M of the spectacle lenses 10, at the same frequency ν.

To obtain a transmission coefficient $CT_M$ for the zone 10_M the value of which is always comprised between the values of the transmission coefficient of the adjacent zones 10_I and 10_S, according to one embodiment, the duty cycle α ($CT_M$) of the transmission coefficient $CT_M$ of the median zone 10_M will possibly be a simple function of the duty cycle α ($CT_S$) of the transmission coefficient $CT_S$ of the median zone 10_S, for example:

$$\alpha(CT_M) = \frac{\alpha(CT_S)}{2}$$

According to a variant embodiment, the lower zone 10_I does not include liquid crystals and for example consists of a simple transparent lens, the value of the transmission coefficient $CT_I$ of the lower zone 10_I possibly then reaching a value close to 100%.

Therefore, according to the invention, an adaptive optical filter has indeed been produced for a spectacle lens 10, the filter comprising at least two zones, a zone 10_I in which the light transmission coefficient $CT_I$ is constant and of maximum value, preferably about 100%, in order to allow the spectacle wearer to perfectly distinguish objects in the near field in front of him; and a zone 10_S in which the light transmission coefficient $CT_S$ is variable between:
  a minimum value $CT_{min}$ of almost zero in order to prevent dazzling by light sources in the far field of view of the spectacle wearer, and
  a maximum value $CT_{MAX}$ that is the highest allowed by the technology used to vary this transmission coefficient, in order to allow the spectacle wearer to observe the far field in the scene in front of him.

If the control signal controlling the transmission coefficient is issued from a luminosity sensor, the transmission coefficient of the adaptive optical filter is adjusted in real-time depending on the luminosity of the scene observed by the spectacle wearer: the higher the luminosity, the darker the adaptive optical filter, and vice versa.

For the comfort of the spectacle wearer, it is possible according to the present invention to add a third zone 10_M, in which the light transmission coefficient $CT_M$ is variable, its value remaining at any instant comprised between the values of the transmission coefficients of the adjacent zones 10_I and 10_S.

For an even better comfort of the spectacle wearer, the number of intermediate zones, between the lower zone 10_I having the fixed and minimum transmission coefficient $CT_I$ and the upper zone 10_S having the variable transmission coefficient $CT_S$, will possibly be multiplied, each intermediate zone having a light transmission coefficient comprised between the transmission coefficient of the adjacent zones.

Other embodiments of the invention may be envisioned to obtain the same result.

Figure 5:
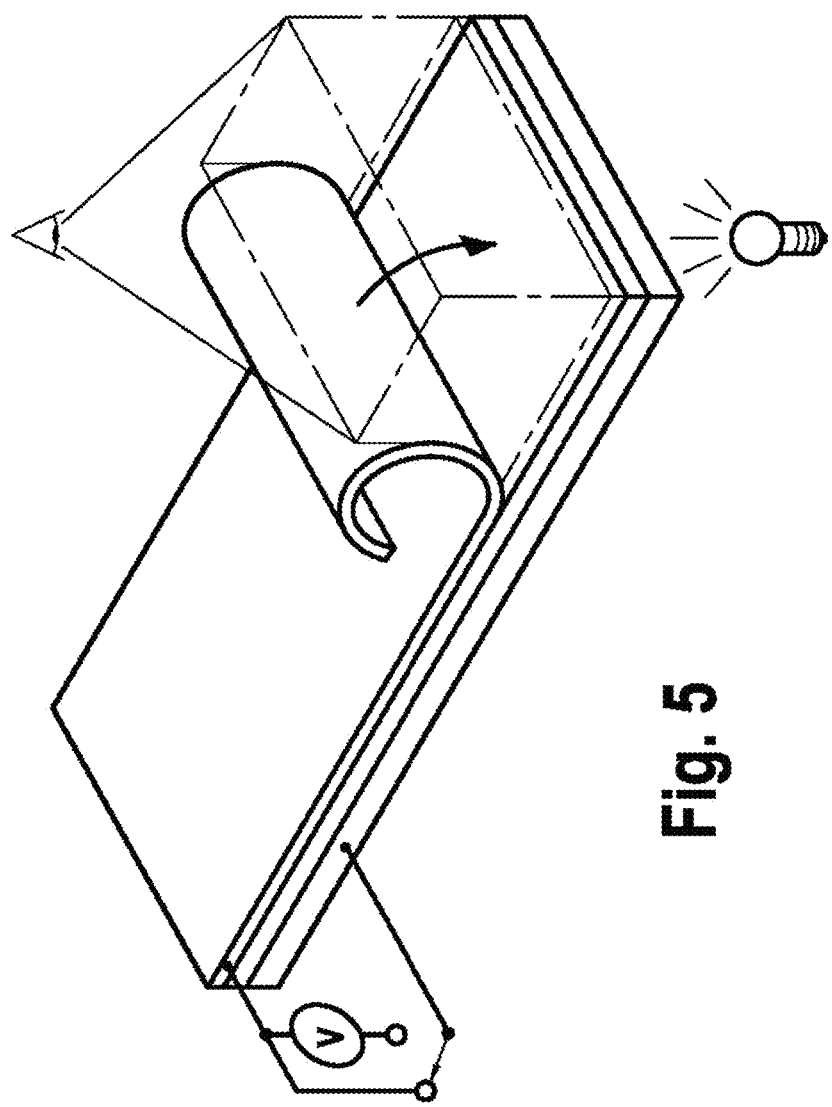
FIG. 5 schematically shows in perspective, on a very large scale, the filter in FIG. 1, according to a second embodiment.

Instead of using liquid-crystal cells as the variable transmission coefficient materials, micro-optical-electromechanical systems (known by the acronym MOEMS or MEMS), such as that schematically shown in FIG. 5, will possibly be used. Such systems are for example described in documents U.S. Pat. No. 4,248,501 or 5,784,189 to which the reader may refer.

Such systems are also controllable by an electronic signal, and their light transmission coefficient may be controlled at frequencies and with duty cycles compatible with the present invention.

Of course, the present invention is not limited to the embodiments described above; indeed, those skilled in the art will in contrast be able to make many modifications thereto without departing from its scope.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. An adaptive optical filter for a spectacle lens, comprising at least two separate zones (10_M, 10_S), one being at least one upper zone and another being at least one lower zone, each of said at least one upper zone and said at least one lower zone being defined by an instantaneous value of at least one optical property,
    wherein said at least one optical property (CT) of at least one of said at least two separate zones (10_M, 10_S) of said adaptive optical filter is variable over time between a maximum value ($CT_{MAX}$) and a minimum value ($CT_{min}$);
    wherein said at least one optical property is a light transmission coefficient (CT);
    wherein a coefficient of transmission of said at least one lower zone is greater than a coefficient of transmission of said at least one upper zone.

2. The adaptive optical filter as claimed in claim 1, wherein said light transmission coefficient (CT) of at least one of said at least two separate zones (10_M, 10_S) of said adaptive optical filter is variable according to a pulse width modulation (PWM).

3. The adaptive optical filter as claimed in claim 2, wherein said light transmission coefficient (CT) of at least one of said at least two separate zones (10_M, 10_S) of said adaptive optical filter depends on a duty cycle (α) of said pulse width modulation (PWM) cycle.

4. The adaptive optical filter as claimed in claim 3, wherein said duty cycle (α) of said pulse width modulation (PWM) cycle of said light transmission coefficient (CT) of one of said at least two separate zones (10_M) depends on said duty cycle (α) of said pulse width modulation (PWM) cycle of said light transmission coefficient (CT) of an adjacent zone (10_S).

5. The adaptive optical filter as claimed in claim 2, wherein said light transmission coefficient is controlled by a control signal issued from a photosensitive sensor.

6. The adaptive optical filter as claimed in claim 2, wherein said adaptive optical filter comprises a zone (10_I), said light transmission coefficient ($CT_I$) of which is constant over time.

7. The adaptive optical filter as claimed in claim 1, wherein at least one of said at least two separate zones (10_M, 10_S) of said adaptive optical filter includes a liquid-crystal cell.

8. The adaptive optical filter as claimed in claim 1, wherein at least one of said at least two separate zones (10_M, 10_S) of said adaptive optical filter includes a micro-optical-electromechanical system (MEMS).

9. The adaptive optical filter as claimed in claim 1, wherein said adaptive optical filter includes said at least two separate zones (10_M, 10_S), said light transmission coefficient (CT) of each of said at least two separate zones (10_M, 10_S) of which is variable over time between a maximum value ($CT_{MAX}$) and a minimum value ($CT_{min}$).

10. The adaptive optical filter as claimed in claim 9, wherein said light transmission coefficient (CT) of one of said at least two separate zones (10_M) depends on said light transmission coefficient (CT) of the other of said at least two separate zones (10_S).

11. The adaptive optical filter as claimed in claim 10, wherein a duty cycle ($\alpha$) of said pulse width modulation (PWM) cycle of said light transmission coefficient (CT) of one of said at least two separate zones (10_M) depends on said duty cycle ($\alpha$) of said pulse width modulation (PWM) cycle of said light transmission coefficient (CT) of an adjacent zone (10_S).

12. The adaptive optical filter as claimed in claim 1, wherein said light transmission coefficient is controlled by a control signal issued from a photosensitive sensor.

13. The adaptive optical filter as claimed in claim 12, wherein said photosensitive sensor emits a signal the value of which depends on a light intensity that it receives from a scene in front of a spectacle wearer.

14. The adaptive optical filter as claimed in claim 1, wherein said light transmission coefficient is controlled by a manual control signal.

15. The adaptive optical filter as claimed in claim 1, wherein said adaptive optical filter comprises a zone (10_I), said light transmission coefficient ($CT_I$) of which is constant over time.

16. The adaptive optical filter as claimed in claim 1, wherein said light transmission coefficient is controlled by a control signal issued from a photosensitive sensor.

17. A spectacle lens comprising:
an adaptive optical filter having:
at least two separate zones (10_M, 10_S), one being at least one upper zone and another being at least one lower zone, each of said at least one upper zone and said at least one lower zone being defined by an instantaneous value of at least one optical property,
wherein said at least one optical property (CT) of at least one of said at least two separate zones (10_M, 10_S) of said adaptive optical filter is variable over time between a maximum value ($CT_{MAX}$) and a minimum value ($CT_{min}$);
wherein said at least one optical property is a light transmission coefficient (CT);
wherein a coefficient of transmission of said at least one lower zone is greater than a coefficient of transmission of said at least one upper zone.

* * * * *